United States Patent
Shuto (10) Patent No.: US 8,854,914 B2
(45) Date of Patent: Oct. 7, 2014

(54) SEMICONDUCTOR MEMORY DEVICE

(71) Applicant: Kabushiki Kaisha Toshiba, Tokyo (JP)

(72) Inventor: Susumu Shuto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/953,466

(22) Filed: Jul. 29, 2013

(65) Prior Publication Data

US 2014/0254275 A1  Sep. 11, 2014

(30) Foreign Application Priority Data

Mar. 8, 2013  (JP) ................................ 2013-046617

(51) Int. Cl.
*G11C 8/08* (2006.01)

(52) U.S. Cl.
CPC ........................................ *G11C 8/08* (2013.01)
USPC ................. 365/230.06; 365/145; 365/189.09; 365/189.11

(58) Field of Classification Search
USPC ....................................................... 365/230.06
See application file for complete search history.

(56) References Cited

U.S. PATENT DOCUMENTS

| | | | |
|---|---|---|---|
| 6,385,076 B1 * | 5/2002 | Fujimori | ........................ 365/145 |
| 6,720,596 B2 * | 4/2004 | Ohtsuka et al. | ................ 257/295 |
| 6,876,030 B2 | 4/2005 | Uchiyama et al. | |
| 8,081,499 B2 | 12/2011 | Takahashi et al. | |

FOREIGN PATENT DOCUMENTS

| | | |
|---|---|---|
| JP | 2002-100743 A | 4/2002 |
| JP | 2006-303293 A | 11/2006 |
| JP | 2010-219455 A | 9/2010 |

* cited by examiner

*Primary Examiner* — Son Mai
(74) *Attorney, Agent, or Firm* — Holtz, Holtz, Goodman & Chick PC (57) ABSTRACT

According to one embodiment, a memory cell, a word line, and a peripheral circuit are provided. In the memory cell, a ferroelectric film is provided for a gate insulating film. The word line is connected to a control gate electrode of the memory cell. In the peripheral circuit, ferroelectric films are provided for gate insulating films and the peripheral circuit is provided near the memory cell. Here, between the same conductive type transistors of the peripheral circuit, a channel impurity concentration of a transistor to which a driving voltage which drives the word line is applied is different from a channel impurity concentration of a transistor to which a voltage which is lower than the driving voltage is applied.

20 Claims, 5 Drawing Sheets

SEMICONDUCTOR MEMORY DEVICE

CROSS-REFERENCE TO RELATED APPLICATION

This application is based upon and claims the benefit of priority from Japanese Patent Application No. 2013-046617, filed on Mar. 8, 2013; the entire contents of which are incorporated herein by reference.

FIELD

Embodiments described herein relate generally to a semiconductor memory device.

BACKGROUND

In order to cope with the miniaturization of a memory cell, some semiconductor memory devices use a ferroelectric transistor (FeFET) for a memory cell. In the ferroelectric transistor, a direction of polarization of a ferroelectric film is reversed to store data.

DETAILED DESCRIPTION

In general, according to one embodiment, a memory cell, a word line, and a peripheral circuit are provided. In the memory cell, a ferroelectric film is provided for a gate insulating film. The word line is connected to a control gate electrode of the memory cell. In the peripheral circuit, ferroelectric films are provided for the gate insulating films and the peripheral circuit is provided near the memory cell. Here, between the same conductive type transistors of the peripheral circuit, a channel impurity concentration of a transistor to which a driving voltage which drives the word line is applied is different from a channel impurity concentration of a transistor to which a voltage which is lower than the driving voltage is applied.

Hereinafter, a semiconductor memory device according to an embodiment will be described in detail with reference to accompanying drawings. However, the present invention is not limited to the embodiments.

First Embodiment

Figure 1:
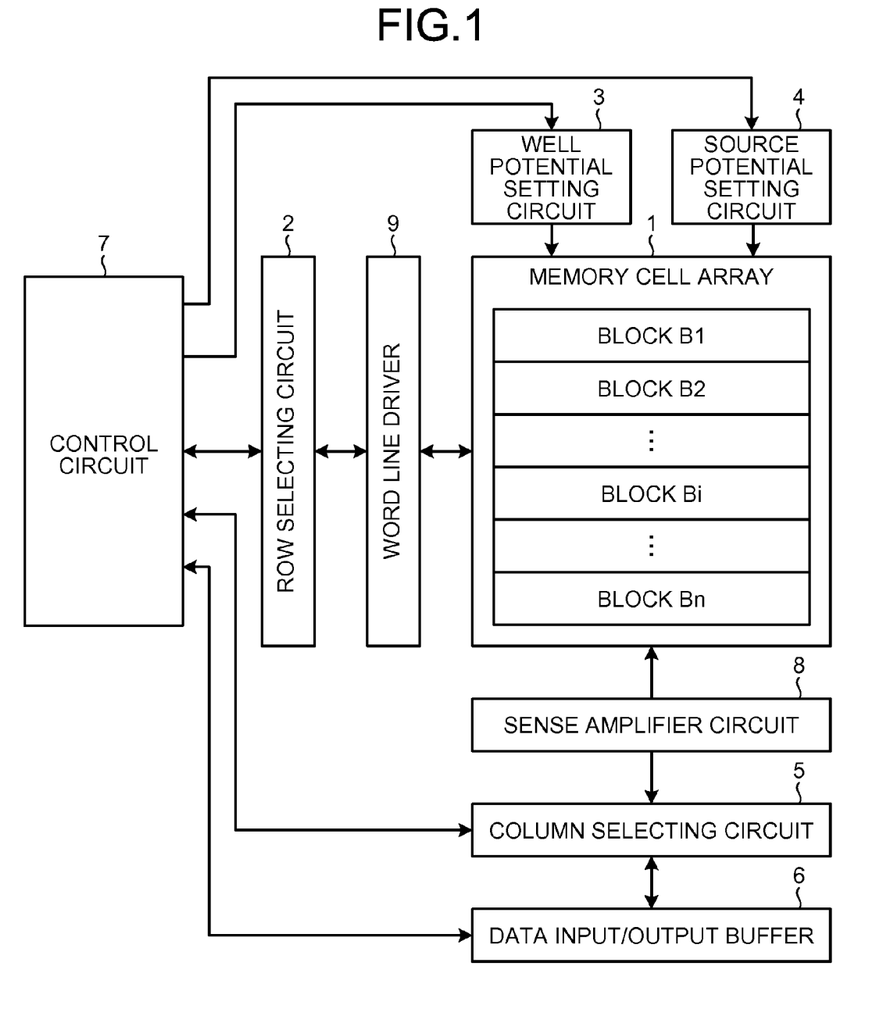
FIG. 1 is a block diagram illustrating a schematic configuration of a semiconductor memory device according to a first embodiment.

FIG. 1 is a block diagram illustrating a brief configuration of a semiconductor memory device according to a first embodiment.

Referring to FIG. 1, the semiconductor memory device includes a memory cell array 1, a row selecting circuit 2, a well potential setting circuit 3, a source potential setting circuit 4, a column selecting circuit 5, a data input/output buffer 6, a control circuit 7, a sense amplifier circuit 8, and a word line driver 9. Further, the row selecting circuit 2, the well potential setting circuit 3, the source potential setting circuit 4, the column selecting circuit 5, the data input/output buffer 6, the control circuit 7, the sense amplifier circuit 8, and the word line driver 9 may configure a peripheral circuit of a memory cell array 1. In such a peripheral circuit, a transistor in which a ferroelectric film is provided for a gate insulating film is provided.

In the memory cell array 1, memory cells which store data are arranged in a matrix in a row direction and a column direction. Further, the memory cell may use a cell transistor in which a ferroelectric film is provided for a gate insulating film. A word line may be connected to a control gate electrode of the cell transistor. One memory cell may store one bit data or may be multivalued so as to store data having two bits or more.

Here, the memory cell array 1 is divided into n (n is a positive integer) blocks B1 to Bn. Further, each of the blocks B1 to Bn may be configured such that a plurality of NAND cell units are arranged in a row direction.

Further, the row selecting circuit 2 may select a memory cell in a row direction of the memory cell array 1 at the time of reading, writing, and erasing operations of the memory cell. The word line driver 9 may output a pumping voltage to drive the word line at the time of reading, writing, and erasing operations of the memory cell. The well potential setting circuit 3 may set a well potential of the memory cell array 1 at the time of reading, writing, and erasing operations of the memory cell. The source potential setting circuit 4 may set a source potential of the memory cell array 1 at the time of reading, writing, and erasing operations of the memory cell. The column selecting circuit 5 may select a memory cell in a column direction of the memory cell array 1 at the time of reading, writing, and erasing operations of the memory cell. The sense amplifier circuit 8 may discriminate data read out from the memory cell at every column. The data input/output buffer 6 may send a command or an address received from the outside to the control circuit 7 or exchange data between the sense amplifier circuit 8 and the outside. The control circuit 7 may control operations of the row selecting circuit 2, the well potential setting circuit 3, the source potential setting circuit 4, and the column selecting circuit 5 based on the command and the address.

Here, in the same conductive type transistors of the peripheral circuit of the memory cell array 1, a channel impurity concentration of a transistor to which a driving voltage (pumping voltage) which drives the word line is applied is different from a channel impurity concentration of a transistor to which a voltage which is lower than the driving voltage is applied. For example, a channel impurity concentration of a P type transistor which is used for the word line driver 9 may be higher than a channel impurity concentration of a P type transistor which is used for a peripheral circuit other than the word line driver 9.

Alternatively, a channel impurity concentration of a P type transistor which is used for the word line driver 9 may be higher than a channel impurity concentration of a P type transistor which is used for the peripheral circuit other than the word line driver 9 and a channel impurity concentration of an N type transistor which is used for the word line driver 9 may be lower than a channel impurity concentration of an N type transistor which is used for the peripheral circuit other than the word line driver 9.

Alternatively, a channel impurity concentration of the N type transistor which is used for the peripheral circuit other than the word line driver 9 may be higher than the channel impurity concentration of the cell transistor which is used for the memory cell.

Alternatively, a channel impurity concentration of an N type transistor which is used for the word line driver 9 may be lower than the channel impurity concentration of the cell transistor which is used for the memory cell.

Figure 2:
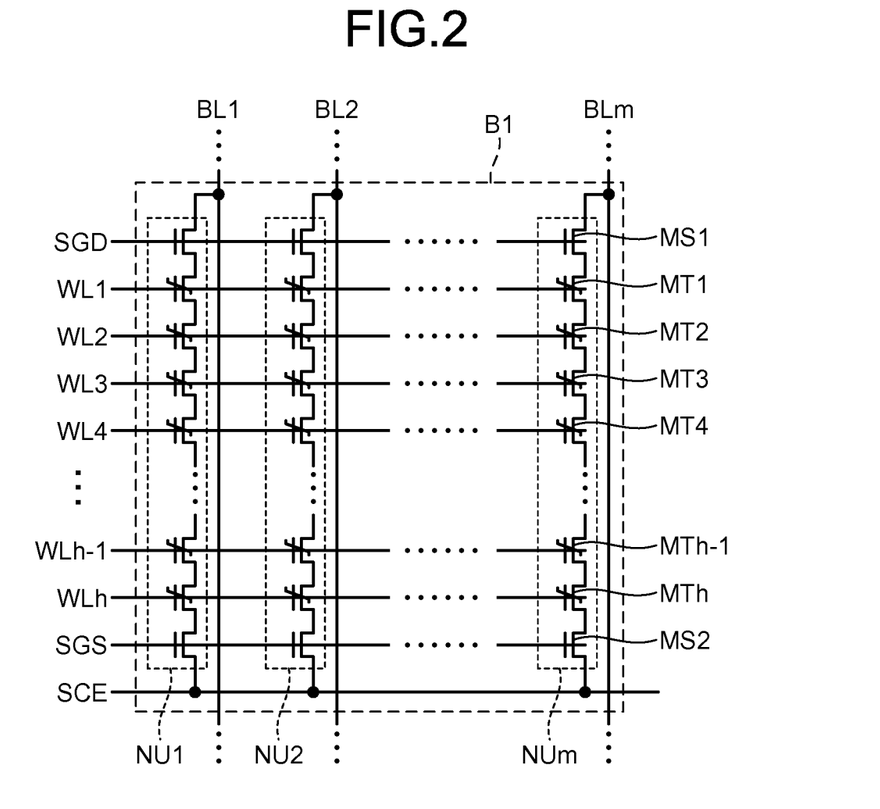
FIG. 2 is a circuit diagram illustrating a schematic configuration of a block of the semiconductor memory device of FIG. 1.

FIG. 2 is a circuit diagram illustrating a schematic configuration of a block of the semiconductor memory device of FIG. 1.

Referring to FIG. 2, each of the blocks B1 to Bn includes h (h is a positive integer) word lines WL1 to WLh, select gate lines SGD and SGS, and a source line SCE. Further, at each of the blocks B1 to Bn, m (m is a positive integer) bit lines BL1 to BLm are commonly provided.

Therefore, at each of the blocks B1 to Bn, m NAND cell units NU1 to NUm are provided and the NAND cell units NU1 to NUm are connected to the bit lines BL1 to BLm, respectively.

Here, in the NAND cell units NU1 to NUm, cell transistors MT1 to MTh and select transistors MS1 and MS2 are provided, respectively. Further, one memory cell of the memory cell array 1 may be configured by one cell transistor. Therefore, the cell transistors MT1 to MTh are connected in series to configure a NAND string and the select transistors MS1 and MS2 are connected to both ends of the NAND string to configure each of NAND cell units NU1 to NUm.

In the NAND cell units NU1 to NUm, word lines WL1 to WLh are connected to control gate electrodes of the cell transistors MT1 to MTh, respectively. Further, in the NAND cell units NU1 to NUm, one end of the NAND string formed of the cell transistors MT1 to MTh is connected to each of the bit lines BL1 to BLm via a select transistor MS1 and the other end of the NAND string is connected to the source line SCE via the select transistor MS2. The select gate line SGD is connected to the control gate electrode of the select transistor MS1 and the select gate line SGS is connected to the control gate electrode of the select transistor MS2.

Figure 3A:
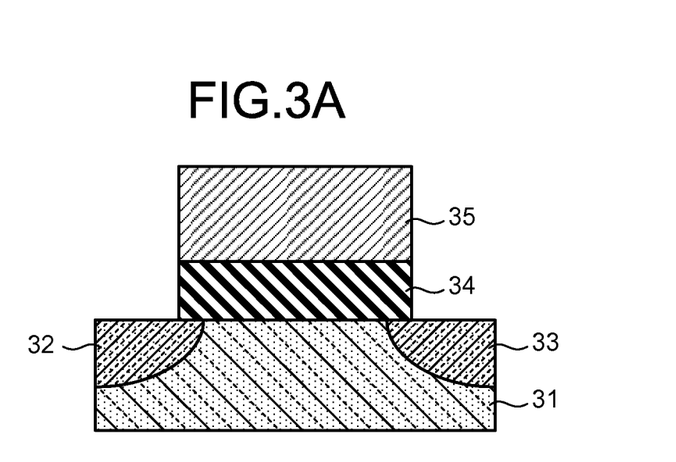
FIG. 3A is a cross-sectional view illustrating an example of a cell transistor of the semiconductor memory device of FIG. 1
Figure 3B:
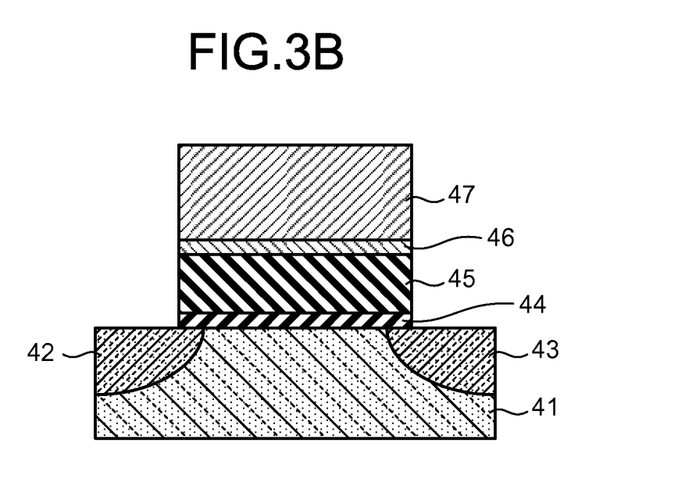
FIG. 3B is a cross-sectional view illustrating another example of the cell transistor of the semiconductor memory device of FIG. 1.

FIG. 3A is a cross-sectional view illustrating an example of the cell transistor of the semiconductor memory device of FIG. 1 and FIG. 3B is a cross-sectional view illustrating another example of the cell transistor of the semiconductor memory device of FIG. 1.

Referring to FIG. 3A, the control gate electrode 35 is provided on a well 31 with a ferroelectric film 34 interposed therebetween. Further, in the well 31, a source layer 33 and a drain layer 32 which are disposed at both sides of the control gate electrode 35 are provided. The well 31 may be formed using a semiconductor such as Si, Ge, SiGe, SiC, SiSn, PbS, GaAs, InP, GaP, GaN, or ZnSe. Further, the well 31 may be formed to be of the P type and the source layer 33 and the drain layer 32 may be formed to be of the N type. The ferroelectric film 34 may use $HfO_2$, for example. 2 to 3 mol % of Si may be added to $HfO_2$. The control gate electrode 35, for example, may use polycrystal silicon or the like.

Further, referring to FIG. 3B, a control gate electrode 47 is provided on the well 41 with an interface insulating film 44, a ferroelectric film 45, and a barrier metal film 46 sequentially interposed therebetween. Further, in the well 41, a source layer 43 and a drain layer 42 which are disposed at both sides of the control gate electrode 47 are provided. The well 41 may use a semiconductor such as Si, Ge, SiGe, SiC, SiSn, PbS, GaAs, InP, GaP, GaN, or ZnSe. The interface insulating film 44 may use $SiO_2$, for example. The ferroelectric film 45 may use $HfO_2$, for example. 2 to 3 mol % of Si may be added to $HfO_2$. The barrier metal film 46 may use TiN or the like. The control gate electrode 47, for example, may use polycrystal silicon or the like.

In addition, in the following description, the cell transistor of FIG. 3A will be described as an example. Further, in the writing operation, a threshold value of the cell transistor migrates from a low value to a high value; in the erasing operation, the threshold value of the cell transistor migrates from a high value to a low value. Further, when "0" is stored in the memory cell, the threshold value is low and when "1" is stored in the memory cell, the threshold value is high.

Figure 4A:
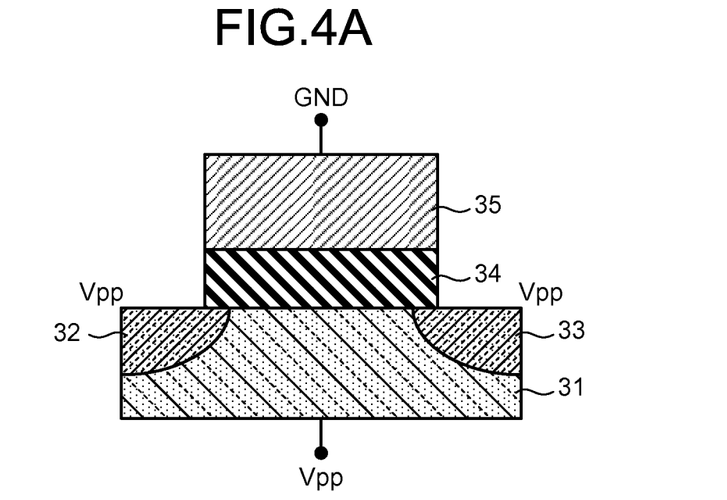
FIG. 4A is a cross-sectional view illustrating a writing voltage applying method of the semiconductor memory device of FIG. 1
Figure 4B:
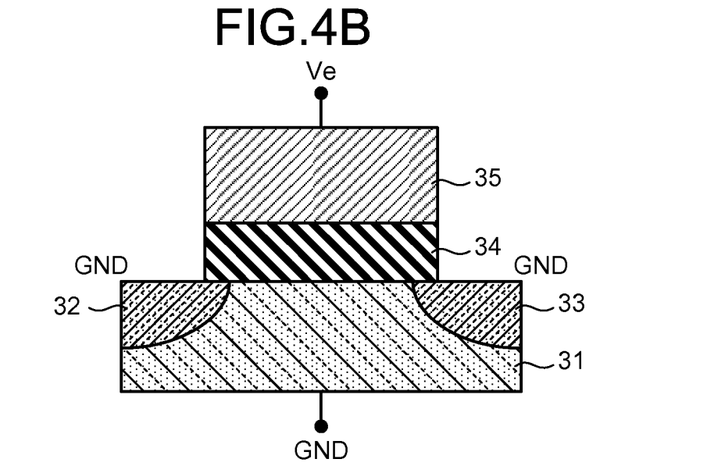
FIG. 4B is a cross-sectional view illustrating an erasing voltage applying method of the semiconductor memory device of FIG. 1.

FIG. 4A is a cross-sectional view illustrating a writing voltage applying method of the semiconductor memory device of FIG. 1 and FIG. 4B is a cross-sectional view illustrating an erasing voltage applying method of the semiconductor memory device of FIG. 1.

Referring to FIG. 4A, in the writing operation, 0 V is applied to the word lines WL1 to WLh of the blocks B1 to Bn and the well potential of the memory cell array 1 is set to a writing voltage Vpp (for example, 6 V). Further, the source layer 33 and the drain layer 32 may be set to the writing voltage Vpp. In this case, a high voltage is applied to the ferroelectric film 34 so that the channel side is positive and the control gate electrode 35 side is negative. Therefore, the ferroelectric film 34 is polarized so that the channel side is negative and the control gate electrode 35 side is positive and the threshold value of the cell transistor rises.

In the method of FIG. 4A, in order to perform the writing operation, a method of applying the writing voltage Vpp to the well 31, the source layer 33, and the drain layer 32 of the memory cell and applying 0 V to the control gate electrode 35 has been described. However, 0 V may be applied to the well 31, the source layer 33, and the drain layer 32 of the memory cell and −Vpp may be applied to the control gate electrode 35.

Referring to FIG. 4B, in the erasing operation, an erasing voltage Ve (for example, 6 V) is applied to a selective word line and 0 V is applied to a selective bit line. A voltage sufficient to turn on a non-selective cell of the NAND string including the selective cell is applied to a non-selective word line and an erasing prohibition voltage Vfe (for example, 1 V) is applied to a non-selective bit line. Further, a voltage which turns on the select transistor MS1 is applied to the select gate line SGD and a voltage which turns off the select transistor MS2 is applied to the select gate line SGS.

By doing this, the voltage of 0 V which is applied to the selective bit line is transferred to the selective cell through the select transistor MS1 and the non-selective cell and the well 31, the source layer 33, and the drain layer 32 are set to 0 V. In this case, since the erasing voltage Ve is applied to the selective word line, a high voltage is applied to the ferroelectric film 34 so that the channel side is negative and the control gate electrode 35 side is positive. Therefore, the ferroelectric film 34 is polarized so that the channel side is positive and the control gate electrode 35 side is negative and the threshold value of the cell transistor drops.

In the meantime, in the NAND cell connected to the non-selective bit line, the erasing prohibition voltage Vfe is applied to the non-selective bit line so that the select transistor MS1 is turned off. As a result, the cell transistors MT1 to MTh of the NAND cell which are connected to the non-selective bit line are in a floating state and a potential of the channel of the non-selective cell connected to the selective word line rises (self boost) so as to follow the erasing voltage Ve which is applied to the selective word line. Therefore, in the non-selective cell connected to the selective word line, the voltage applied to the ferroelectric film 34 drops and thus the polarization of the ferroelectric film 34 may not be changed.

Figure 5:
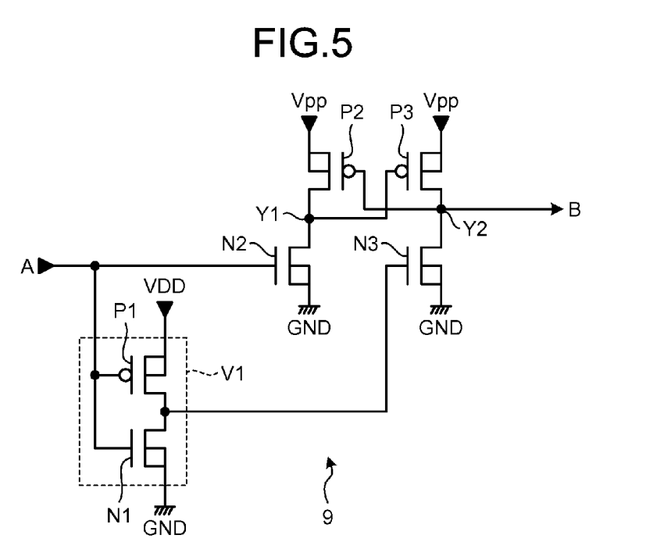
FIG. 5 is a circuit diagram illustrating a schematic configuration of a level converter used for a word line driver of FIG. 1.

FIG. 5 is a circuit diagram illustrating a schematic configuration of a level converter used in a word line driver of FIG. 1.

Referring to FIG. 5, a level converter which converts a power supply potential VDD into a pumping voltage (writing voltage Vpp) is provided in the word line driver 9. In the level converter, an inverter V1, P type transistors P2 and P3, and N type transistors N2 and N3 are provided. In the inverter V1, a P type transistor P1 and an N type transistor N1 are provided.

The P type transistor P1 and the N type transistor N1 are connected to each other in series. A source of the P type transistor P1 is connected to a power supply potential VDD and a source of the N type transistor N1 is connected to a ground potential GND. A word line selecting signal A is input to a gate of the P type transistor P1 and a gate of the N type transistor N1. Further, the power supply potential VDD may be set to 1.2 V. The word line selecting signal A may migrate between 0 V and 1.2 V.

The P type transistor P2 and the N type transistor N2 are connected to each other in series via a node Y1 and the P type transistor P3 and the N type transistor N3 are connected to each other in series via a node Y2. The writing voltage Vpp is applied to sources of the P type transistors P2 and P3 and sources of the N type transistors N2 and N3 are connected to the ground potential GND. A gate of the P type transistor P2 is connected to the node Y2 and a gate of the P type transistor P3 is connected to the node Y1. The word line selecting signal A is input to a gate of the N type transistor N2 and an output of the inverter V1 is input to a gate of the N type transistor N3. The node Y2 is connected to the word line and a word line driving signal B is output to the word line. Further, the writing voltage Vpp may migrate between 0 V and 6 V.

Here, ferroelectric films are provided for the gate insulating films of the P type transistors P1 to P3 and the N type transistors N1 to N3. These P type transistors P1 to P3 and the N type transistors N1 to N3 may have the same structure as the cell transistors MT1 to MTh of FIG. 2. For example, the P type transistors P1 to P3 and the N type transistors N1 to N3 may have the configuration of FIG. 3A or may have the configuration of FIG. 3B.

Further, channel impurity concentrations of the P type transistors P2 and P3 may be higher than a channel impurity concentration of the P type transistor of the peripheral circuit other than the word line driver 9.

In the writing operation, the writing voltage Vpp rises, for example, to 6 V. In the non-selective word line, the word line selecting signal A is set to 0 V and 0 V is applied to the gate of the N type transistor N2. Further, the word line selecting signal A is input to the gate of the N type transistor N3 via the inverter V1 so that 1.2 V is applied to the gate of the N type transistor N3. Therefore, the N type transistor N2 is turned off, the N type transistor N3 is turned on, and the potential of the node Y2 is set to 0 V to turn on the P type transistor P2. If the P type transistor P2 is turned on, the potential of the node Y1 is set to 6 V to turn off the P type transistor P3. Therefore, the word line driving signal B becomes 0 V and 0 V is applied to the non-selective word line.

In the meantime, in the selective word line, the word line selecting signal A is set to 1.2 V and 1.2 V is applied to the gate of the N type transistor N2. Further, the word line selecting signal A is input to the gate of the N type transistor N3 via the inverter V1 so that 0 V is applied to the gate of the N type transistor N3. Therefore, the N type transistor N2 is turned on, the N type transistor N3 is turned off, and a potential of the node Y1 is set to 0 V to turn on the P type transistor P3. If the P type transistor P3 is turned on, the potential of the node Y2 is set to 6 V to turn off the P type transistor P2. Therefore, the word line driving signal B becomes 6 V and 6 V is applied to the selective word line.

In this case, in the P type transistors P2 and P3, 6 V is applied between the well 31 and the control gate electrode 35 and the ferroelectric film 34 is polarized so that the channel side is positive and the control gate electrode 35 side is negative and threshold values of the P type transistors P2 and P3 are lowered. Since a voltage of 6 V is not reversely applied between the well 31 and the control gate electrode 35, if the threshold values of the P type transistors P2 and P3 temporarily become lower, the threshold value is stably maintained. Here, the channel impurity concentrations of the P type transistors P2 and P3 become higher than the channel impurity concentration of the P type transistor of the peripheral circuit other than the word line driver 9 so that an amount of the reduced threshold values of the P type transistors P2 and P3 due to the polarization of the ferroelectric film 34 may be lessened. Therefore, it is possible to use transistors having the same structure in both memory cell array 1 and the peripheral circuit and thus the number of processes of individually preparing the transistors in the memory cell array 1 and the peripheral circuit is reduced to efficiently perform the manufacturing process. A changed amount of the channel impurity concentration of the P type transistors P2 and P3 with respect to the channel impurity concentration of the P type transistor of the peripheral circuit other than the word line driver 9 may be set so as to cancel the variation in the threshold value due to the polarization of the P type transistors P2 and P3.

Further, the channel impurity concentrations of the P type transistors P2 and P3 may be higher than the channel impurity concentration of the P type transistor of the peripheral circuit other than the word line driver 9 and the channel impurity concentrations of the N type transistors N2 and N3 may be lower than the channel impurity concentration of the N type transistor for the peripheral circuit other than the word line driver 9.

Here, in the N type transistors N2 and N3, a voltage of 6 V is not applied between the well 31 and the control gate electrode 35. In contrast, voltages of 0 V and 6 V are applied to the control gate electrode 35 and the drain layer 32 of the N type transistors N2 and N3, respectively. In this case, if an overlapping portion of the control gate electrode 35 and the drain layer 32 of the N type transistors N2 and N3 is large, a voltage of 6 V is applied to the ferroelectric film 34 of the overlapping portion and if the ferroelectric film 34 is polarized in one direction using the voltage as a trigger, the threshold values of the N type transistors N2 and N3 are shifted. Therefore, the channel impurity concentrations of the N type transistors N2 and N3 are set to be lower than the channel impurity concentration of the N type transistor used for the peripheral circuit other than the word line driver 9 so that an amount of the shifted threshold value of the N type transistors N2 and N3 due to the polarization of the ferroelectric film 34 may be lessened.

Further, the channel impurity concentration of the N type transistor which is used for a peripheral circuit other than the word line driver 9 may be higher than a channel impurity concentration of the cell transistors MT1 to MTh.

Here, in the cell transistors MT1 to MTh, the threshold value at the time of writing operation and the threshold value at the time of erasing operation are symmetrically set with 0 V therebetween. Therefore, the threshold value of the cell transistors MT1 to MTh immediately after being sent from the manufacturing process is almost 0 V. In the meantime, it is desirable that in the peripheral circuit of the memory cell array 1, the threshold value of the transistor is set to approximately 0.4 V and the transistor is turned off when 0 V is applied to the control gate electrode 35. Therefore, the channel impurity concentration of the N type transistor which is used for a peripheral circuit other than the word line driver 9 may be higher than a channel impurity concentration of the cell transistors MT1 to MTh.

Further, the channel impurity concentrations of the N type transistors N2 and N3 may be lower than the channel impurity concentration of the cell transistors MT1 to MTh.

Here, as the difference between the threshold values of the cell transistors MT1 to MTh at the time of the writing operation and the erasing operation becomes larger, a reading margin of data is increased so that it is possible to stabilize an operation of the memory. If variation of characteristics of the cell transistors MT1 to MTh is considered, it is desirable that the threshold value at the time of wiring operation is 0.5 V or higher and the threshold value at the time of erasing operation is −0.5 V or lower. In the meantime, if a general circuit configuration is considered, it is desirable that the threshold values of the N type transistors N2 and N3 are 0.5 V or lower. Accordingly, even when the threshold values of the N type transistors N2 and N3 are high (a writing status in the cell transistors MT1 to MTh), the threshold values of the N type transistors N2 and N3 are desirably 0.5 V or lower and thus lower than a threshold value of the cell transistors MT1 to MTh in the writing status. Therefore, the channel impurity concentrations of the N type transistors N2 and N3 may be lower than the channel impurity concentrations of the cell transistors MT1 to MTh.

Second Embodiment

Figure 6:
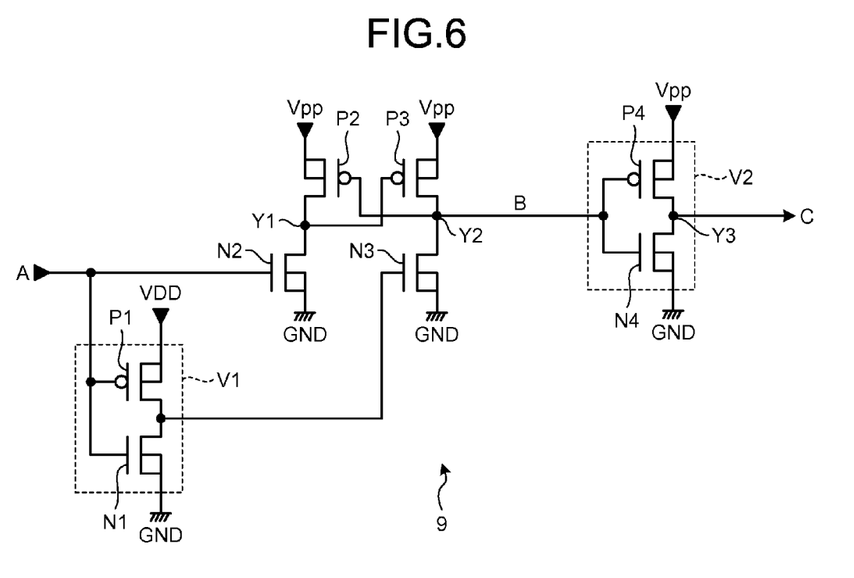
FIG. 6 is a circuit diagram illustrating a schematic configuration of a level converter used for a word line driver of a semiconductor memory device according to a second embodiment.

FIG. 6 is a circuit diagram illustrating a schematic configuration of a level converter used in a word line driver of a semiconductor memory device according to a second embodiment.

Referring to FIG. 6, in the level converter, an inverter V2 is added at a rear stage of the level converter of FIG. 5. In the inverter V2, a P type transistor P4 and an N type transistor N4 are provided.

The P type transistor P4 and the N type transistor N4 are connected to each other in series via a node Y3. The writing voltage Vpp is applied to a source of the P type transistor P4 and a source of the N type transistor N4 is connected to the ground potential GND. A word line driving signal B is input to a gate of the P type transistor P4 and a gate of the N type transistor N4. The node Y3 is connected to the word line and a word driving signal C is output to the word line.

Here, ferroelectric films are provided for gate insulating films of the P type transistor P4 and the N type transistor N4. The P type transistor P4 and the N type transistor N4 may have the same structure as the cell transistors MT1 to MTh of FIG. 2. For example, the P type transistor P4 and the N type transistor N4 may have the configuration of FIG. 3A or may have the configuration of FIG. 3B.

Therefore, the word line driving signal B output from the node Y2 is converted into a word line driving signal C through the inverter V2 and the converted signal is output to the word line. Here, by adding the inverter V2 to the rear stage of the level converter of FIG. 5, it is possible to improve a driving force of the word line.

In this case, in the P type transistor P4, 6 V is applied between the well 31 and the control gate electrode 35 and the ferroelectric film 34 is polarized so that the channel side is positive and the control gate electrode 35 side is negative and threshold values of the P type transistors P2 and P3 are lowered. Further, a channel impurity concentration of the P type transistor P4 may be higher than a channel impurity concentration of the P type transistor of the peripheral circuit other than the word line driver 9. By doing this, an amount of reduced threshold value of the P type transistor P4 due to the polarization of the ferroelectric film 34 may be lessened and the number of processes of individually preparing the transistors in the memory cell array 1 and the peripheral circuit is reduced to efficiently perform the manufacturing process.

Further, the channel impurity concentration of the P type transistor P4 may be higher than the channel impurity concentration of the P type transistor of the peripheral circuit other than the word line driver 9 and the channel impurity concentration of the N type transistor N4 may be lower than the channel impurity concentration of the N type transistor for the peripheral circuit other than the word line driver 9. Further, the channel impurity concentration of the N type transistor N4 may be lower than the channel impurity concentration of the cell transistors MT1 to MTh.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell in which a ferroelectric film is provided for a gate insulating film;
   a word line which is connected to a control gate electrode of the memory cell; and
   a peripheral circuit which has transistors in which ferroelectric films are provided for gate insulating films and is provided near the memory cell,
   wherein between the same conductive type transistors of the peripheral circuit, a channel impurity concentration of a transistor to which a driving voltage which drives the word line is applied is different from a channel impurity concentration of a transistor to which a voltage which is lower than the driving voltage is applied.

2. The semiconductor memory device according to claim 1, wherein the peripheral circuit includes a word line driver which drives the word line, and
   a channel impurity concentration of a P type transistor used for the word line driver to which the driving voltage is applied is higher than a channel impurity concentration of a P type transistor used for the peripheral circuit other than the word line driver.

3. The semiconductor memory device according to claim 2, wherein an N type transistor having a channel impurity concentration which is lower than a channel impurity concentration of an N type transistor used for the peripheral circuit other than the word line driver is used for the word line driver.

4. The semiconductor memory device according to claim 2, wherein the channel impurity concentration of the N type transistor used for the peripheral circuit other than the word line driver is higher than a channel impurity concentration of a cell transistor used for the memory cell.

5. The semiconductor memory device according to claim 2, wherein an N type transistor having a channel impurity concentration which is lower than a channel impurity concentration of a cell transistor used for the memory cell is used for the word line driver.

6. The semiconductor memory device according to claim 1, wherein cell transistors each included in the memory cell are connected in series to form a NAND string and select transistors are connected to both ends of the NAND string to form a NAND cell unit.

7. The semiconductor memory device according to claim 1, wherein the peripheral circuit includes:
a word line driver which drives the word line;
a row selecting circuit which selects the memory cell in a row direction;
a well potential setting circuit which sets a well potential of the memory cell;
a source potential setting circuit which sets a source potential of the memory cell;
a column selecting circuit which selects a bit line selecting the memory cell in a column direction; and
a sense amplifier circuit which discriminates data read out from the memory cell at every column.

8. The semiconductor memory device according to claim 7, wherein the word line driver includes a level converter which converts a power supply potential into a pumping voltage, and
the level converter includes:
a first inverter in which a first P type transistor and a first N type transistor are provided;
a second N type transistor where a first signal having the power supply potential or a ground potential is applied to a gate;
a third N type transistor where an inverted signal obtained by inverting the first signal using the first inverter is applied to a gate;
a second P type transistor which is connected to the second N type transistor in series via a first node;
a third P type transistor which is connected to the third N type transistor in series via a second node; and
a second inverter in which a fourth P type transistor and a fourth N type transistor are provided,
a gate of the second P type transistor is connected to the second node, a gate of the third P type transistor is connected to the first node, and a gate of the fourth P type transistor and a gate of the fourth N type transistor are connected to the second node, and
the ferroelectric films are provided for gate insulating films of the second P type transistor, the third P type transistor, and the fourth P type transistor and channel impurity concentrations of the second P type transistor, the third P type transistor, and the fourth P type transistor are higher than channel impurity concentrations of P type transistors used for the row selecting circuit, the well potential setting circuit, the source potential setting circuit, the column selecting circuit, and the sense amplifier circuit, the ferroelectric films being provided for gate insulating films of the P type transistors.

9. The semiconductor memory device according to claim 1, wherein the memory cell includes:
an interface insulating layer formed on a semiconductor;
the ferroelectric film formed on the interface insulating layer;
a barrier metal film formed on the ferroelectric film; and
the control gate electrode formed on the barrier metal film.

10. The semiconductor memory device according to claim 2, wherein the word line driver includes a level converter which converts a power supply potential into a pumping voltage.

11. The semiconductor memory device according to claim 10,
wherein the level converter includes:
a first inverter in which a first P type transistor and a first N type transistor are provided;
a second N type transistor where a first signal having the power supply potential or a ground potential is applied to a gate;
a third N type transistor where an inverted signal obtained by inverting the first signal using the first inverter is applied to a gate;
a second P type transistor which is connected to the second N type transistor in series via a first node; and
a third P type transistor which is connected to the third N type transistor in series via a second node,
the ferroelectric films are provided for gate insulating films of the second P type transistor, the third P type transistor, the second N type transistor, and the third N type transistor, and
a gate of the second P type transistor is connected to the second node and a gate of the third P type transistor is connected to the first node.

12. The semiconductor memory device according to claim 11, wherein the pumping voltage is applied to a source of the second P type transistor and a source of the third P type transistor.

13. The semiconductor memory device according to claim 12, wherein channel impurity concentrations of the second P type transistor and the third P type transistor are higher than channel impurity concentrations of other P type transistors used for the peripheral circuit, the ferroelectric films being provided for gate insulating films of the other P type transistors.

14. The semiconductor memory device according to claim 12, wherein channel impurity concentrations of the second P type transistor and the third P type transistor are higher than channel impurity concentrations of other P type transistors used for the peripheral circuit, the ferroelectric films being provided for gate insulating films of the other P type transistor and channel impurity concentrations of the second N type transistor and the third N type transistor are lower than channel impurity concentrations of other N type transistors used for the peripheral circuit, the ferroelectric films being provided for gate insulating films of the other N type transistors.

15. The semiconductor memory device according to claim 14, wherein the channel impurity concentrations of the other N type transistors are higher than a channel impurity concentration of a cell transistor used for the memory cell.

16. The semiconductor memory device according to claim 14, wherein the channel impurity concentrations of the second N type transistor and the third N type transistor are lower than a channel impurity concentration of a cell transistor used for the memory cell.

17. The semiconductor memory device according to claim 12,
wherein the level converter further includes:
a second inverter in which a fourth P type transistor and a fourth N type transistor are provided; and the ferroelectric films are provided for gate insulating films of the fourth P type transistor and the fourth N type transistor and gates of the fourth P type transistor and the fourth N type transistor are connected to the second node.

18. The semiconductor memory device according to claim 17, wherein the pumping voltage is applied to a source of the fourth P type transistor.

19. The semiconductor memory device according to claim 18, wherein channel impurity concentrations of the second P type transistor, the third P type transistor, and the fourth P type transistor are higher than channel impurity concentrations of other P type transistors used for the peripheral circuit, the ferroelectric films being provided for gate insulating films of the other P type transistors.

20. The semiconductor memory device according to claim 18, wherein channel impurity concentrations of the second P type transistor, the third P type transistor, and the fourth P type transistor are higher than channel impurity concentrations of other P type transistors used for the peripheral circuit, the ferroelectric films being provided for gate insulating films of the other P type transistors and channel impurity concentrations of the second N type transistor, the third N type transistor, and the fourth N type transistor are lower than channel impurity concentrations of other N type transistors used for the peripheral circuit, the ferroelectric films are provided for gate insulating films of the other N type transistors.

* * * * *